(12) United States Patent
Tan

(10) Patent No.: US 6,500,019 B1
(45) Date of Patent: Dec. 31, 2002

(54) ELECTRICAL SOCKET

(75) Inventor: Shijie Tan, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/126,054

(22) Filed: Apr. 18, 2002

(30) Foreign Application Priority Data

Dec. 26, 2001 (TW) .................................. 90223010 U

(51) Int. Cl.[7] .......................................... H01R 13/625
(52) U.S. Cl. ...................................................... 439/342
(58) Field of Search ................................ 439/342, 259, 439/263, 264, 265, 266, 268

(56) References Cited

U.S. PATENT DOCUMENTS 6,280,224 B1 * 8/2001 Huang ........................ 439/342

* cited by examiner

Primary Examiner—Tho D. Ta
(74) Attorney, Agent, or Firm—WeiTe Chung

(57) ABSTRACT

A ZIF PGA mobile socket (1) includes a base (2), a cover (3) slidably mounted on the base, a number of electrical contacts, a ring (5) secured in the cover, a cam (4) partially received in the ring, and a washer (42). The cam of the socket rotates in the metallic ring when driven by an external tool, thereby driving the cover to slide along the base, opening and closing the engagement between pins of a chip mounted on the cover and the electrical contacts mounted in the base. The cam has a riveting portion (413) extending downwardly beyond the base. The washer includes a support portion (422) being riveted to the cam by the riveting portion and a peripheral portion (423) has no engagement with the base. The support portion is thicker than the peripheral portion.

4 Claims, 6 Drawing Sheets

ELECTRICAL SOCKET

BACKGROUND OF THE INVENTION

1. Field of the Invention

The present invention relates to an electrical socket, and particularly to a ZIF (Zero Insertion Force) mobile socket for use with a PGA (Pin Grid Array) chip.

2. Description of the Related Art

A ZIF socket is often used to mount a PGA chip onto a printed circuit board (PCB). Referring to FIGS. 5 and 6, one example of such connectors 6 comprises a base 7, a cover 8 mounted onto the base 7, a plurality of electrical contacts (not shown) received in the base 7, a metallic cam 9, a metallic ring 91, and a metallic washer 92. The metallic ring 91 is assembled in the cover 9 of the socket 6 by loosely fitting, interferentially fitting, or by being adhesively bound into a hole in the cover 8. The cover 8 is actuated to slide on the base 7 by the rotation of the metallic cam 9 in the ring 91 and a hole of the base 7, thereby causing pins of the PGA chip mounted on the cover to engage with/disengage from the electrical contacts in the base 7.

The metallic cam 9 comprises a riveting portion 93 to be riveted to the washer 92 to prevent the cam 9 from falling off from the base 7 and the cover 8. The washer 92 is generally planar and has thus a uniform thickness throughout the configuration thereof. The washer 92 is also comparatively slim since the electrical socket 6 as whole is small due to the application thereof. During the course of riveting the riveting portion 93 to the washer 92, the washer 92 is in the danger of whole deformation because of the uniform thickness thereof and the comparatively small dimension thereof. Furthermore, the washer 92 is partly supported by a bottom wall of the base 7, so the deformation of the washer 92 sometimes causes the washer 92 to interferentially engage with the bottom wall of the base 7 because materials from which the washer 92 and the base 7 are made are different and the force needed to rivet the riveting portion 93 to the washer 92 is large. When the washer 92 engages with the base 7, the rotation of the metallic cam 9 will be adversely affected.

Therefore, an improved washer is desired to overcome the disadvantages of the related art. An approach is made as disclosed in the copending application with a Ser. No. 10/108,124 filed on Mar. 27, 2002 and the same assigned with the instant invention.

SUMMARY OF THE INVENTION

The major object of the present invention is to provide a ZIF PGA socket having a washer which ensures the rotation of a metallic cam of the ZIF PGA socket.

An electrical socket in accordance with the present invention comprises a base, a cover slidably mounted onto the base, a metallic ring secured in the cover, a cam partially received in the ring, a plurality of electrical contacts received in the base, and a washer. The base comprises a first flange located at one side thereof and defining a hole extending through the first flange. A plurality of passageways are defined in the base and each passageway accommodates one of the electrical contacts. The cover defines a plurality of passages corresponding to the passageways of the base into which pins of a PGA package mounted on the cover fit. The cover also forms a corresponding second flange which cooperates with the first flange, and the second flange defines an aperture therethrough corresponding to the hole of the base. The cam comprises a head, an upper disk, a lower disk and a riveting portion. The coincident rotational axes of the head and the upper disk are offset from the rotational axis of the lower disk. The upper disk is received in the ring while the head is supported a top face of the cover. The lower disk of the cam extends through the hole of the first flange. The washer comprises a support portion to which the riveting portion of the cam is riveted and a peripheral portion has no engagement with a bottom face of the base. The support portion is thicker than the peripheral portion to be supported by the lower disk in the course of riveting the riveting portion of the cam thereto and to provide a strength to endure a riveting force applied thereto.

Other objects, advantages and novel features of the invention will become more apparent from the following detailed description of the present embodiment when taken in conjunction with the accompanying drawings.

DETAILED DESCRIPTION OF THE INVENTION

Figure 1:
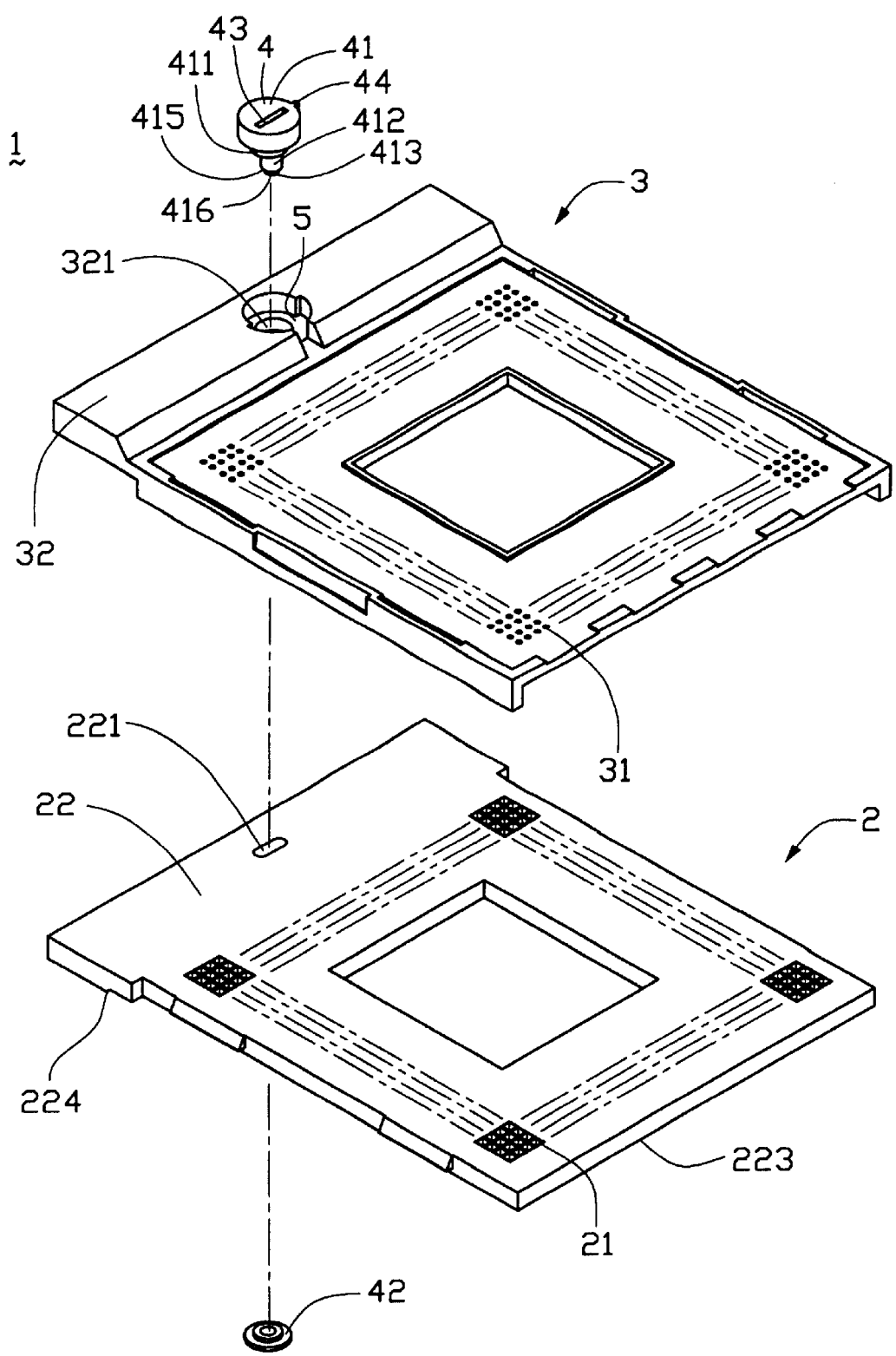
FIG. 1 is an exploded view of a ZIF PGA socket in accordance with the present invention.

Referring to FIG. 1, an electrical mobile socket connector 1 in accordance with the present invention comprises an insulative base 2, a dielectric cover 3, a metallic cam 4, a washer 42, a plurality of electrical contacts (not shown), and a metallic ring 5.

The base 2 is generally rectangular and comprises a plurality of passageways 21 extending therethrough and a flange 22 located at one side thereof. The electrical contacts of the socket connector are received in the passageways 21. The flange 22 comprises a hole 221 defined therein and a stand-off 224 protruding downwardly beyond a bottom face 223 of the rest portion of the base 2.

The cover 3 has a shape corresponding to that of the base 2, and comprises a plurality of passages 31 extending therethrough and a flange 32 corresponding to the flange 22 of the base 2. The flange 32 defines an aperture 321 therethrough. The aperture 321 is generally circular in shape.

The metallic ring 5 is constructed in ways known to one of ordinary skill in the pertinent art and is secured in the aperture 321 of the cover 3 in ways known to persons skilled in the pertinent art, so a detailed description is omitted herefrom. The metallic ring 5 can be omitted so long as the cover 3 is strong enough to withstand the wear caused by the rotation of the metallic cam 4 in the aperture 321. A metallic ring (not shown) corresponding to the hole 221 of the base 2, on the other hand, can be provided in ways known to persons skilled in the pertinent art, if desired, to promote the endurance of the insulative base 2 with respect to the metallic cam 4.

The metallic cam 4 comprises a head 41, an upper disk 411 extending downwardly from the head 41, a lower disk 412 and a riveting portion 413. The head 41 is coaxial with the upper disk 411 and has a diameter larger than the upper disk 411. The head 41 defines an elongated groove 43 recessed from an upper surface thereof and is formed with a lateral protrusion 44 protruding from a lateral side (not labeled) thereof. The elongated groove 43 has two closed opposing longitudinal ends. Thus, an external tool can be confinedly fitted into the groove 43 to exert a rotational force on the cam 4, without the possibility that the external tool may slide along the groove 43 beyond the periphery of the upper surface of the head 41. The lower disk 412 is formed under the upper disk 411 and the riveting portion 413 is located at a lower end 415 of the lower disk 412. A rotational axis of the lower disk 412 is offset from a rotational axis of the upper disk 411. The riveting portion 413 comprises a lower end 416.

Figure 3:
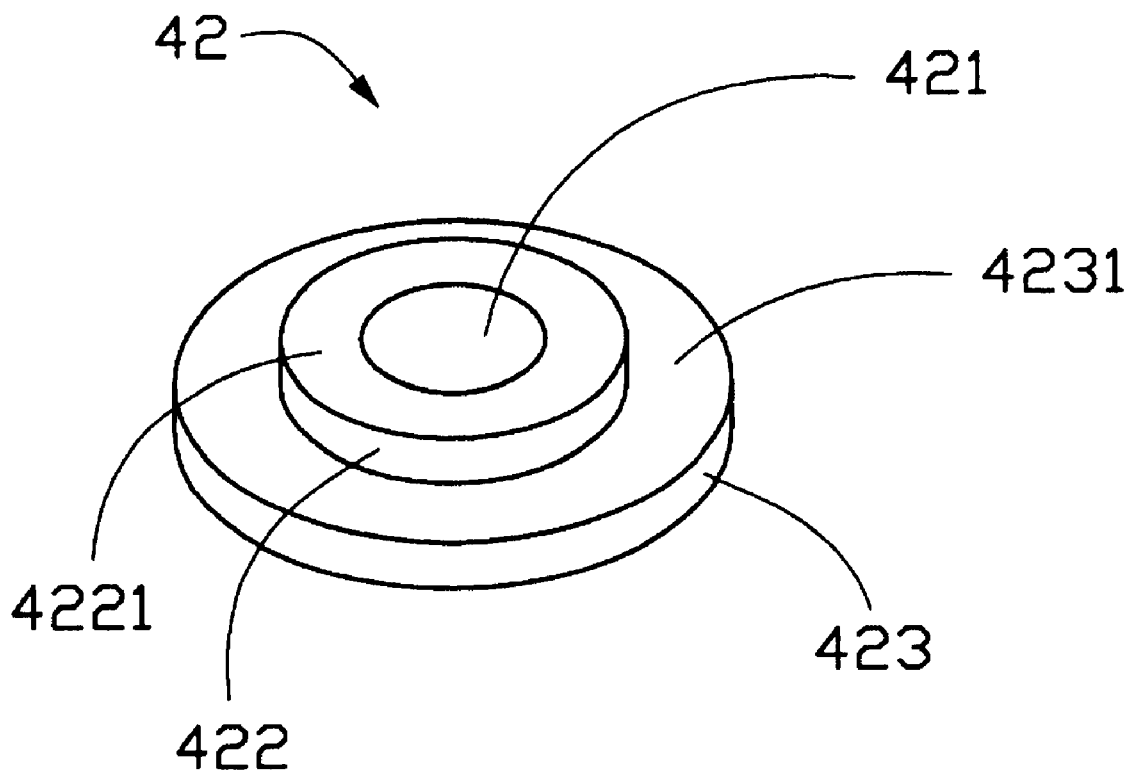
FIG. 3 is a perspective view of a washer of the ZIF PGA socket of FIG. 1.

The washer 42 is made of a metallic or other suitable material. Referring also to FIG. 3, the washer 42 comprises an annular support portion 422 in an inner portion thereof and an annular peripheral portion 423 extending outwardly from the support portion 422. The support portion 422 defines a circular through hole 421 in a center thereof and has a thickness larger than the peripheral portion 423 in such a way that a top face 4221 thereof extends vertically beyond a top face 4231 of the peripheral portion 423.

Figure 2:
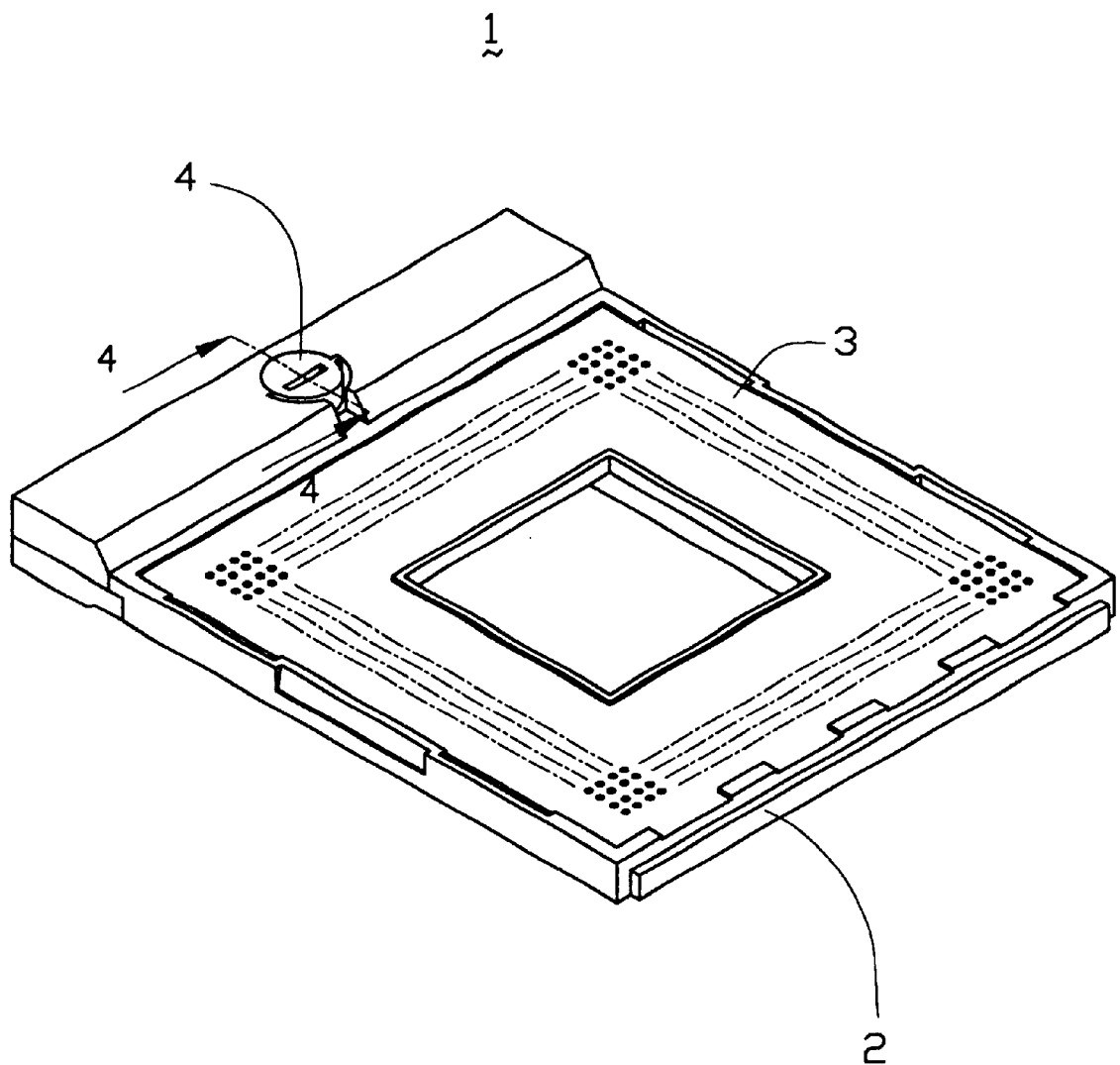
FIG. 2 is an assembled perspective view of the ZIF PGA socket of FIG. 1.
Figure 4:
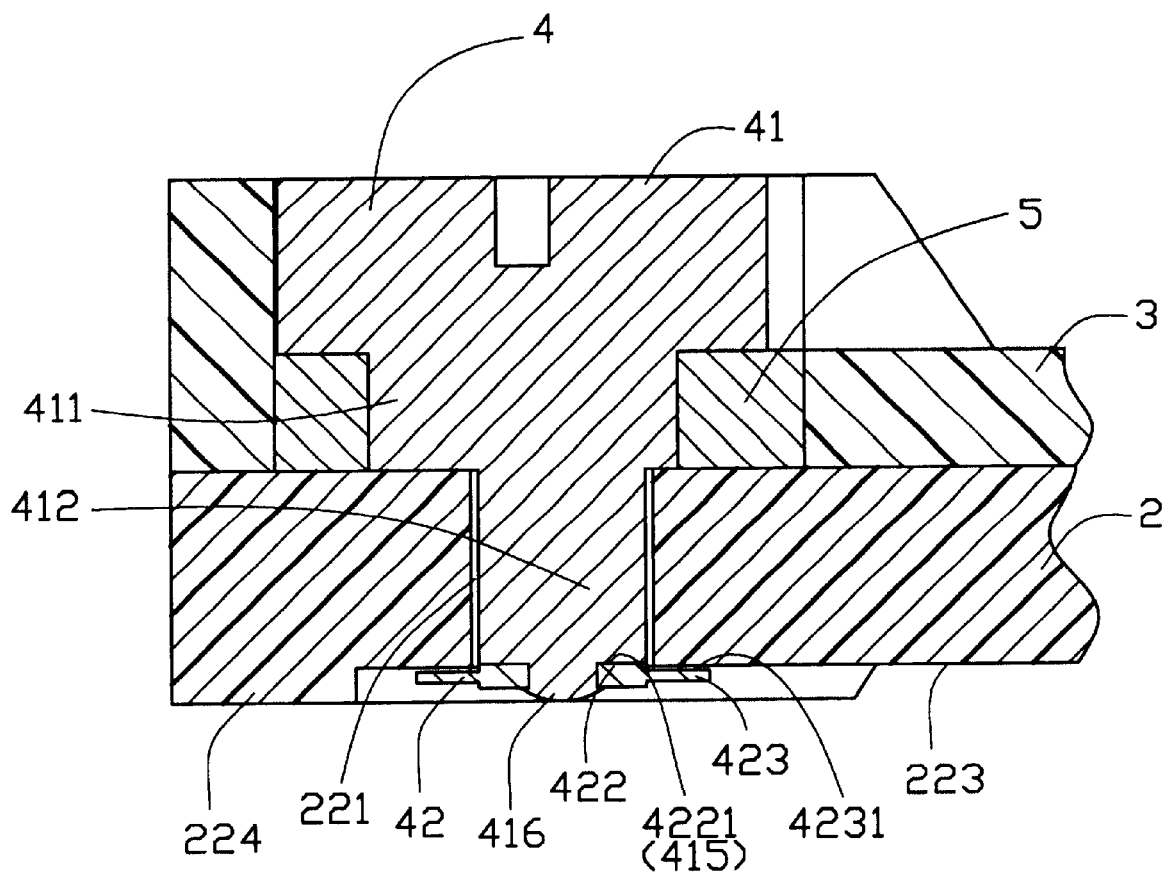
FIG. 4 is a cross-sectional view taken from line 4—4 of FIG. 2.
Figure 5:
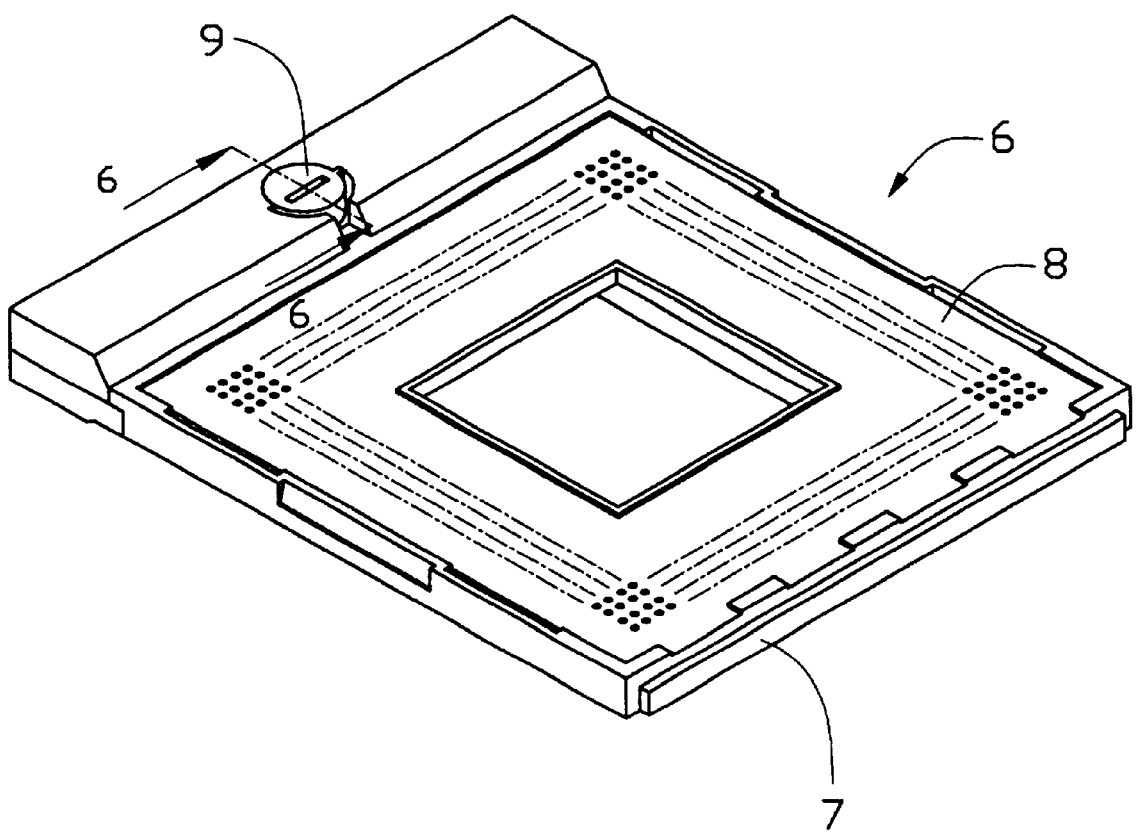
FIG. 5 is an assembled perspective view of a ZIF PGA socket related to the present invention.
Figure 6:
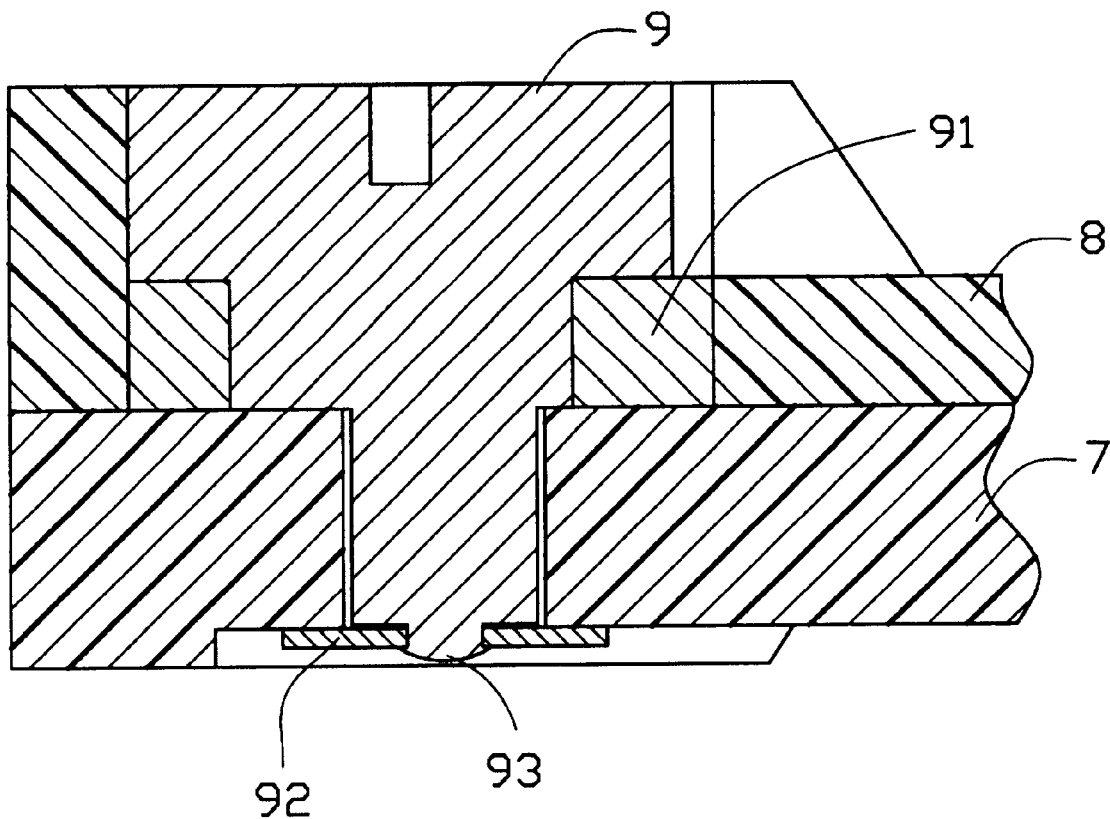
FIG. 6 is a cross-sectional view taken from line 6—6 of FIG. 5.

In assembly, referring also to FIGS. 2 and 4, the cover 3 is, as is the case with any ZIF PGA socket, slidably mounted on the base 2. The upper disk 411 of the cam 4 is received in the ring 5 and the head 40 is abuttable against to be supported by a top face of the ring 5. The lower disk 412 of the cam 4 is accommodated in the hole 221 of the base 2 and the riveting portion 45 extends beyond the bottom face 223 of the base 2 through the through hole 421 of the support portion 422 of the washer 42 to rivet the support portion 422 to the cam 4. The peripheral portion 423 abuts against the bottom face 223. In such a way, the cam 4 is rotatably secured to the base 2 and the cover 3 by the washer 42.

In operation, after a PGA chip (not shown) is loaded on the cover 3, the external tool is fitted into the groove 43 to rotate the cam 4 until the lateral protrusion 44 engages with one of cover stop surfaces (not labeled). Since the axis of the lower disk 412 is offset from the axis of the head 41, the rotation of the cam 4 forces the cover 3 to slide along the base 2 in a diagonal direction, thereby making the pins (not shown) of the PGA chip engage with the contacts in the passageways 21. To open the pin-socket contacts connection, the cam 4 is rotated in an opposite direction from the one stop surface to the other stop surface, thereby disengaging the pins of the chip from the contacts of the socket and allowing the chip to be removed from the cover 3.

The support portion 422 of the washer 42 has the thickness larger than the peripheral portion 423 to provide a strength enough to withstand a riveting force applied thereto, so the peripheral portion 423 is relieved from the risk of deformation during riveting the riveting portion 413 of the cam 4 to the washer 42. Furthermore, the support portion 422 of the washer 42 has the thickness larger than the peripheral portion 423 such that in riveting, the washer 42 are supported by the lower end 415 of the lower disk 412 of the cam 4 other than the bottom face 223 of the base 2 and thus has no engagement with the bottom face 223 of the base 2, thereby ensuring the rotation of the cam 4. Furthermore, the stand-off 224 of the base 2 ensures that the lower end 416 of the riveting portion 413 has no touch with a printed circuit board (not shown) to which the electrical socket connector 1 is mounted.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket comprising:
    a base comprising a plurality of passageways extending vertically therethrough for receiving a corresponding number of electrical contacts therein, and a first flange defining a hole therethrough;
    a cover comprising a plurality of passages therethrough corresponding to the passageways of the base, and a second flange defining an aperture corresponding to the hole of the first flange;
    a cam rotatably extending in the aperture of the second flange and the hole of the first flange and being able to actuate the cover to slide on the base, the cam comprising a head supported by the second flange and a riveting portion extending downwardly beyond the first flange; and
    a washer comprising a support portion and a peripheral portion, the support portion having a thickness larger than the peripheral portion and being riveted to the cam by the riveting portion, the peripheral portion has no engagement with the first flange;
    wherein the support portion is an inner annular portion of the washer and the peripheral portion is an outer annular portion;
    wherein the peripheral portion comprises a too face and the support portion comprises a top face vertically beyond the top face of the peripheral portion.

2. The electrical socket as claimed in claim 1, wherein the cam comprises an upper disk extending downwardly from the head into the aperture of the second flange and a lower disk extending downwardly from the upper disk into the hole of the first flange, the riveting portion extending downwardly from the lower disk.

3. The electrical socket as claimed in claim 2, wherein the upper disk is coaxial with the head and defines a rotational axis, and the lower disk defines a rotational axis offset from the rotational axis of the upper disk.

4. An electrical socket comprising:
    a base with a plurality of contacts therein and a hole therethrough;
    a cover mounted on the base and slidable relative to the base in a front-to-back direction, said cover defining an aperture in alignment with the hole;
    a cam rotatably received in both said hole and said aperture to actuate the cover to move relative to the base, said cam including a lower end with a riveting portion extending therefrom downwardly beyond the base; and
    a washer fastened to the riveting portion and including concentrically a support portion and peripheral portion; wherein
        the support portion is thicker than the peripheral portion;
        wherein said support portion abuts against the lower end of the cam in a vertical direction perpendicular to said front-to-back direction;

wherein said support portion are substantially dimensionally similar to the lower end;
wherein an upper portion of the support portion is compliantly received in a bottom portion of the hole;
wherein the peripheral portion has no engagement with a bottom face of the base.

* * * * *